(12) United States Patent (10) Patent No.: US 7,808,078 B2
Mita (45) Date of Patent: Oct. 5, 2010

(54) SEMICONDUCTOR DEVICE AND MANUFACTURING METHOD THEREOF

(75) Inventor: Keiji Mita, Gunma (JP)

(73) Assignees: Sanyo Electric Co., Ltd., Moriguchi-shi (JP); Sanyo Semiconductor Co., Ltd., Gunma (JP); Sanyo Semiconductor Manufacturing Co., Ltd., Ojiya-shi (JP)

( * ) Notice: Subject to any disclaimer, the term of this patent is extended or adjusted under 35 U.S.C. 154(b) by 161 days.

(21) Appl. No.: 12/198,614

(22) Filed: Aug. 26, 2008

(65) Prior Publication Data

US 2010/0052101 A1 Mar. 4, 2010

(51) Int. Cl.
*H01L 29/00* (2006.01)

(52) U.S. Cl. .............................. 257/544; 257/E21.334; 257/E29.001

(58) Field of Classification Search .................. 257/544, 257/E29.166, E29.001, E21.334
See application file for complete search history.

(56) References Cited

U.S. PATENT DOCUMENTS 7,700,405 B2 * 4/2010 Min et al. .................... 438/106

2005/0161744 A1 * 7/2005 Frapreau et al. ............. 257/368
2010/0164056 A1 * 7/2010 Min et al. .................... 257/519

FOREIGN PATENT DOCUMENTS

JP 9-97852 4/1997
JP 9-97853 4/1997

* cited by examiner

*Primary Examiner*—David S Blum
(74) *Attorney, Agent, or Firm*—Morrison & Foerster LLP

(57) ABSTRACT

A semiconductor integrated circuit is reduced in size by suppressing lateral extension of an impurity region when impurities in the impurity region are thermally diffused in a semiconductor substrate. A second photoresist is formed on an insulation film. The second photoresist is formed to have second openings K2 on both sides of a P-type impurity region so that the second openings K2 partially overlap the P-type impurity region. The insulation film is etched off together with an underlying surface of the semiconductor substrate using the second photoresist as a mask so as to remove the P-type impurity region partially. Then, phosphorus ions (P+) are implanted into the surface of the semiconductor substrate in the etched-off regions using the second photoresist as a mask to form N-type impurity regions that are adjacent the P-type impurity region. After removing the second photoresist, the impurities in the P-type impurity region and the impurities in the N-type impurity region are thermally diffused.

4 Claims, 9 Drawing Sheets

US 7,808,078 B2

SEMICONDUCTOR DEVICE AND MANUFACTURING METHOD THEREOF

BACKGROUND OF THE INVENTION

1. Field of the Invention

This invention relates to a semiconductor device and its manufacturing method, specifically to a technology to form an isolation region to isolate a well region and a semiconductor element.

2. Description of the Related Art

In a semiconductor integrated circuit, an isolation region to electrically isolate a well region in which MOS transistors are formed and a semiconductor element such as a bipolar transistor from other semiconductor elements is conventionally formed by introducing impurities into a semiconductor substrate and thermally diffusing the impurities. Technologies for this kind of forming of the isolation region is disclosed in Japanese Patent Application Publication Nos. H09-97852 and H09-97853, for example.

When the impurities introduced into the semiconductor substrate are thermally diffused, however, there is a problem that the well region and the isolation region require a large horizontal pattern area that makes reducing a size of the semiconductor integrated circuit difficult because a lateral diffusion is caused along with a vertical diffusion (a diffusion toward a depth of the semiconductor substrate).

SUMMARY OF THE INVENTION

The invention provides a method of manufacturing a semiconductor device. The method includes providing a semiconductor substrate having a surface portion of a first general conductivity type, forming a first impurity region of a second general conductivity type in the surface portion of the semiconductor substrate by introducing impurities into part of the surface portion, removing part of the first impurity region so as to form a recess in the surface portion of the semiconductor substrate, forming a second impurity region of the first general conductivity type adjacent the first impurity region by introducing impurities into part of the surface portion through the recess, and thermally diffusing the impurities in the first impurity region and the impurities in the second impurity region so as to form an impurity diffusion region of the second general conductivity type in the surface portion of the first general conductivity type.

The invention provides another method of manufacturing a semiconductor device. The method includes providing a semiconductor substrate having a surface portion of a first general conductivity type, forming an insulation film on the surface portion of the semiconductor substrate, introducing impurities of a second general conductivity type into a portion of the insulation film, removing part of the portion of the insulation film having the impurities of the second general conductivity type therein so as to expose a portion of the surface portion, forming an impurity region of the first general conductivity type adjacent the portion of the insulation film having the impurities of the second general conductivity type therein by introducing impurities into part of the surface portion through the exposed portion of the surface portion, and thermally diffusing the impurities in the portion of the insulation film and the impurities in the impurity region so as to form an impurity diffusion region of the second general conductivity type in the surface portion of the first general conductivity type.

The invention further provides a semiconductor device that includes a semiconductor substrate of a first general conductivity type, a semiconductor layer of a second general conductivity type disposed on the semiconductor substrate, and an isolation region of the first general conductivity type formed in the semiconductor layer so as to surround and electrically isolate a portion of the semiconductor layer. The width of an upper end of the isolation region is smaller than the width of an lower end of the isolation region.

DETAILED DESCRIPTION OF THE INVENTION

Figure 1A:
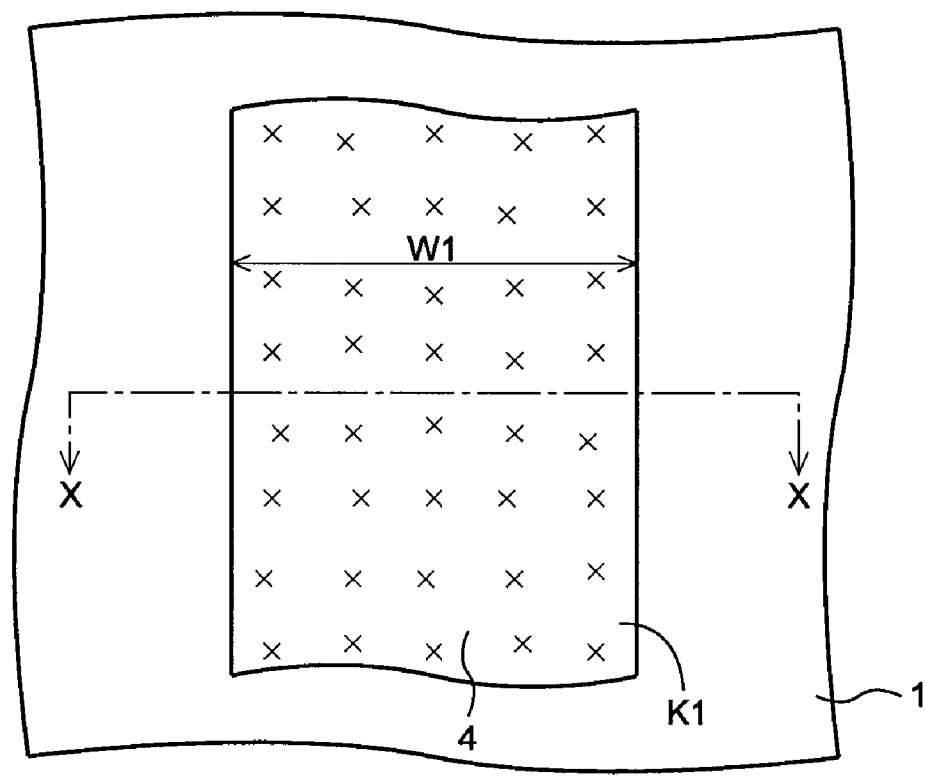
FIGS. 1A and 1B show a method of manufacturing a semiconductor device according to a first embodiment of this invention.
Figure 1B:
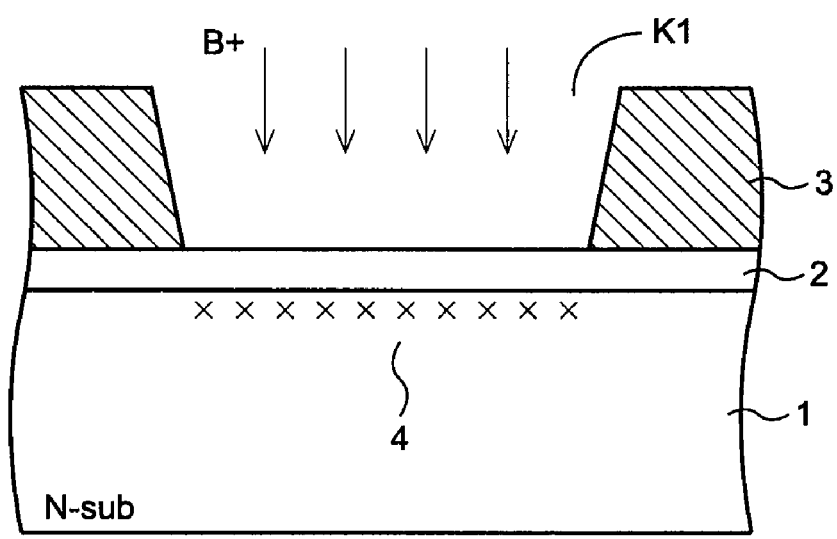
Figure 2A:
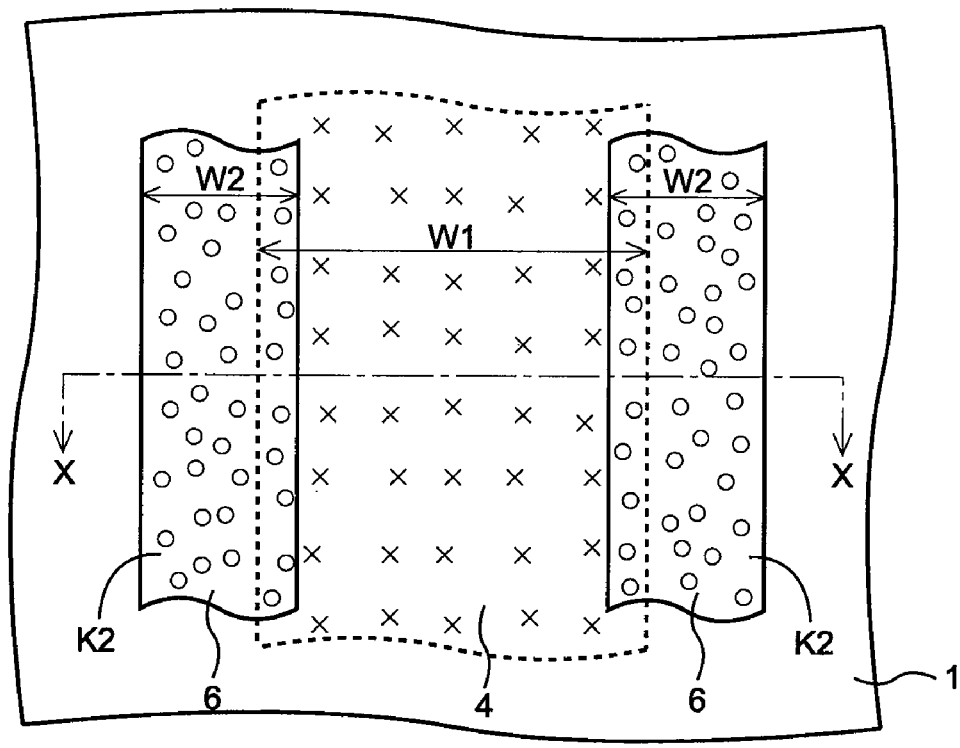
FIGS. 2A and 2B show the method of manufacturing the semiconductor device according to the first embodiment of this invention.

A method of manufacturing a semiconductor device according to a first embodiment of this invention will be described referring to FIGS. 1A, B, 2A and 2B. FIGS. 1A and 2A are partial plan views of the semiconductor device. FIG. 1B is a cross-sectional view showing a section X-X in FIG. 1A, and FIG. 2B is a cross-sectional view showing a section X-X in FIG. 2A.

An insulation film (a silicon oxide film, for example) 2 is formed on a surface of an N-type semiconductor substrate 1 by thermal oxidation, as shown in FIG. 1B. A first photoresist 3 having a first opening K1 is formed on the insulation film 2. Boron ions (B+) are implanted into the surface of the semiconductor substrate 1 through the insulation film 2 in the first opening K1 to form a P-type impurity region 4, using the first photoresist 3 as a mask. The first photoresist 3 is omitted and not shown in FIG. 1A. It is noted that conductivity types such as N+, N and N− belong in one general conductivity type, and conductivity types such as P+, P and P− belong on another general conductivity type.

Figure 2B:
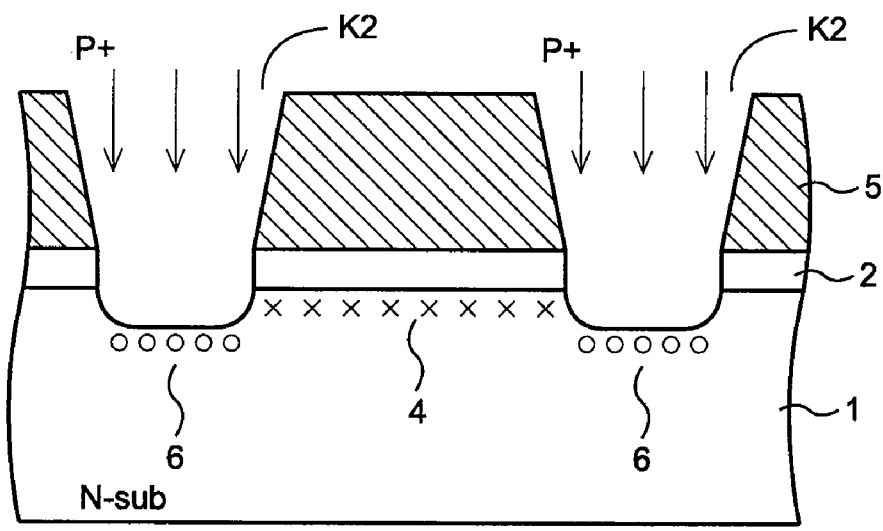

Next, after removing the first photoresist 3, a second photoresist 5 is formed on the insulation film 2, as shown in FIG. 2B. The second photoresist 5 is formed to have second openings K2 on both sides of the P-type impurity region 4 so that the second openings K2 partially overlap the P-type impurity region 4.

The insulation film 2 is etched off using the second photoresist 5 as a mask, preferably together with underlying surface of the semiconductor substrate 1 to remove the P-type impurity region 4 partially. Then, phosphorus ions (P+) are implanted into the surface of the semiconductor substrate 1 in the etched-off regions using the second photoresist 5 as a mask to form N-type impurity regions 6 that are adjacent the P-type impurity region 4. The second photoresist 5 is omitted and not shown in FIG. 2A.

A width W1 of the first opening K1 (boron ion implantation region) in the first photoresist 3 is 5 µm and a width W2 of the second opening K2 (phosphorus ion implantation region) in the second photoresist 5 is 2 µm. When the second photoresist 5 overlaps the P-type impurity region 4 by 0.5 µm, a width of the P-type impurity region 4 is reduced to 4 µm by the etching, since the P-type impurity region 4 is removed by 0.5 µm each on both sides. A width of the N-type impurity region 6 is 2 µm.

Figure 3:
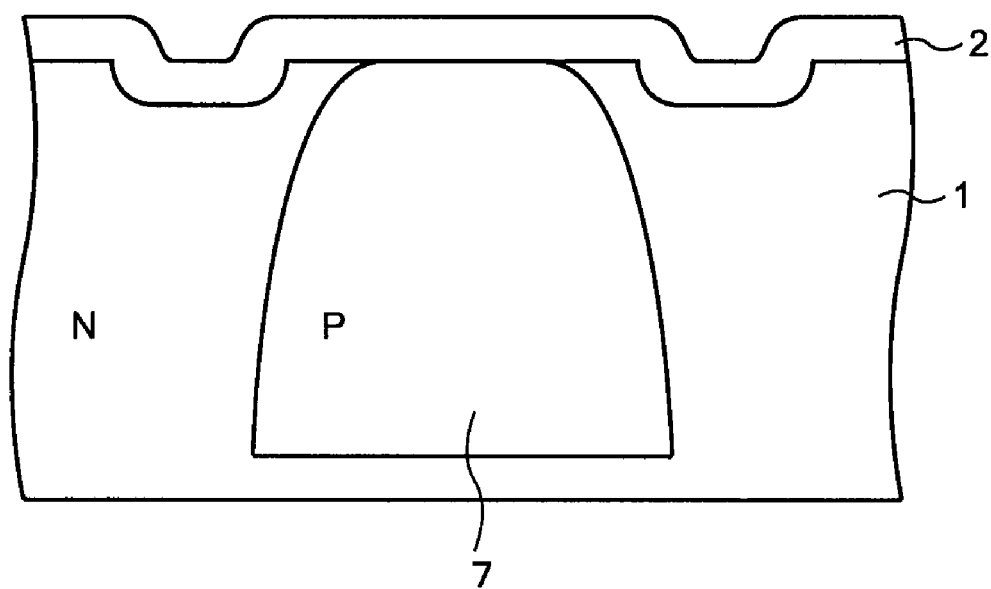
FIG. 3 is a cross-sectional view showing the method of manufacturing the semiconductor device according to the first embodiment of this invention.

After removing the second photoresist 5, the impurities in the P-type impurity region 4 and the impurities in the N-type impurity regions 6 are thermally diffused to extend the P-type impurity region 4 and the N-type impurity regions 6, as shown in FIG. 3. As a result, a P-type impurity diffusion region 7 is formed in the semiconductor substrate 1. At that time, lateral extension of the P-type impurity diffusion region 7 is suppressed because some of the boron impurities (B) from the P-type impurity region 4 are compensated by the phosphorus impurities (P) from the N-type impurity regions 6. That is, even though some of the boron impurities (B) from the P-type impurity region 4 diffuse in lateral direction, they are cancelled to some extent by the phosphorus impurities (P), because the N-type impurity regions 6 are formed laterally adjacent the P-type impurity region 4.

Since the N-type impurity region 6 is formed to overlap regions where the P-type impurity region has been formed and then partially removed by the etching as described above, the P-type impurity region 4 and the N-type impurity regions 6 are formed adjacent to and self-aligned with each other. As a result, the widths of the P-type impurity region 4 and the N-type impurity regions 6 remain invariant and impurity profiles in the impurity regions are consistent even when the second photoresist 5 is misaligned to some extent with the first photoresist 3. Therefore, a variation in impurity profile in the P-type impurity diffusion region 7 after the thermal diffusion can be suppressed.

Boron (B) is used as an example of the P-type impurity, while phosphorus (P) is used as an example of the N-type impurity in the embodiment described above. Other impurities may be used since the compensation takes place between any P-type impurities and any N-type impurities.

As a result of using boron (B) as the P-type impurity and phosphorus (P) as the N-type impurity, the impurity profile of the P-type impurity diffusion region 7 after the thermal diffusion makes a width of the P-type impurity diffusion region 7 narrower at its upper end than at its lower end, as shown in FIG. 3. A diffusion coefficient of boron (B) in silicon is larger than a diffusion coefficient of phosphorus (P) in silicon at 1100° C. and above. A difference between the diffusion coefficients is even greater at 1250° C.

Since boron (B) diffuses faster than phosphorus (P), the width of the P-type impurity diffusion region 7 becomes wider at deeper portion of the semiconductor substrate 1. On the other hand, boron (B) is more likely compensated by phosphorus (P) at shallower portion of the semiconductor substrate 1 because phosphorus (P) diffuses slower than boron (B). With this, lateral extension of the impurity diffusion region 7 is suppressed to reduce its width. The impurity profile of the impurity diffusion region 7, which is characteristic as described above, is effective in reducing horizontal pattern areas of a well region and an isolation region.

Figure 4A:
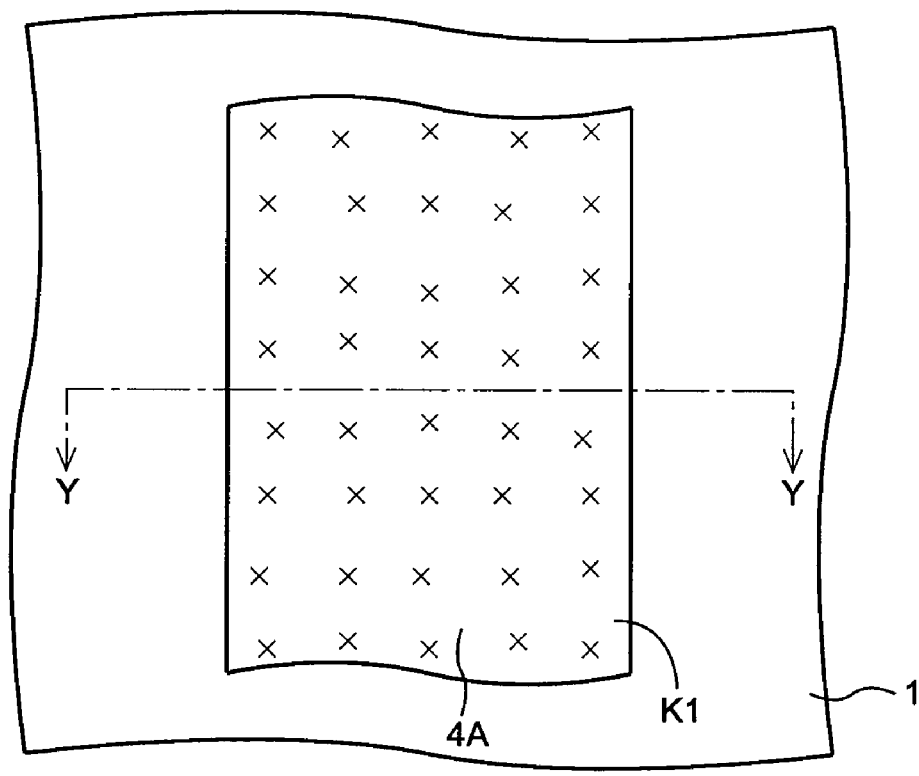
FIGS. 4A and 4B show a method of manufacturing a semiconductor device according to a second embodiment of this invention.
Figure 4B:
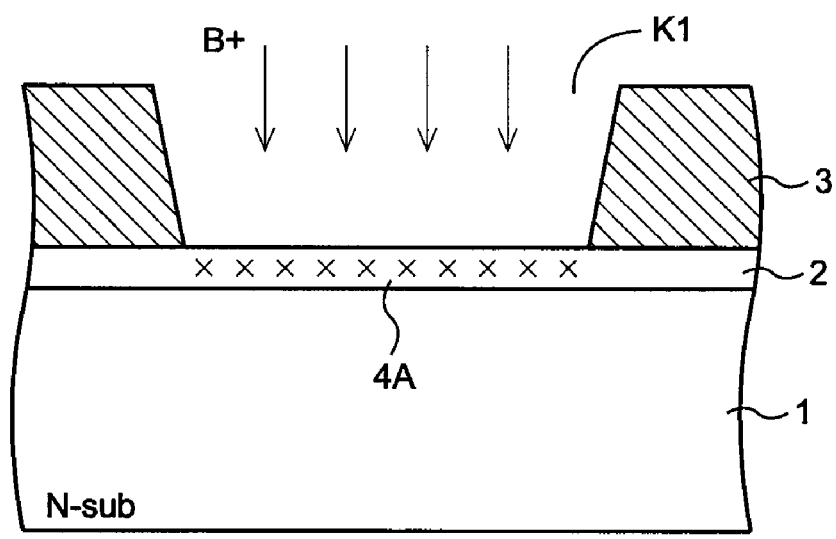
Figure 5A:
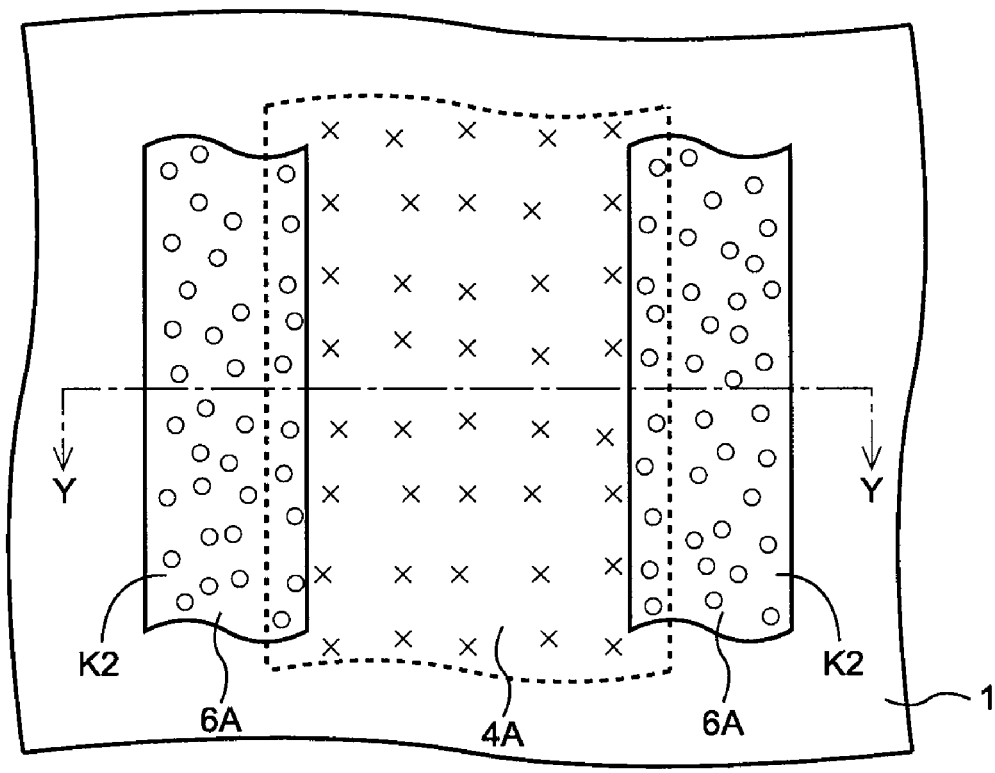
FIGS. 5A and 5B show the method of manufacturing the semiconductor device according to the second embodiment of this invention.

A method of manufacturing a semiconductor device according to a second embodiment of this invention will be described referring to FIGS. 4A, 4B, 5A and 5B. FIGS. 4A and 5A are partial plan views of the semiconductor device. FIG. 4B is a cross-sectional view showing a section Y-Y in FIG. 4A, and FIG. 5B is a cross-sectional view showing a section Y-Y in FIG. 5A.

While boron ions (B+) are implanted into the surface of the semiconductor substrate 1 in the first embodiment, boron ions (B+) are implanted into the insulation film 2 and thereafter thermally diffused into the semiconductor substrate 1 in the second embodiment.

As in the first embodiment, the first photoresist 3 having the first opening K1 is formed on the insulation film 2, and the boron ions (B+) are implanted into the insulation film 2 in the first opening K1 to form a P-type impurity region 4A, as shown in FIG. 4B. At that time, an acceleration energy of the ion implantation is set to be lower than that in the first embodiment. The reason to do so is to place a peak of distribution of the implanted boron ions (B+) within the insulation film 2. The first photoresist 3 is omitted and not shown in FIG. 4A.

Figure 5B:
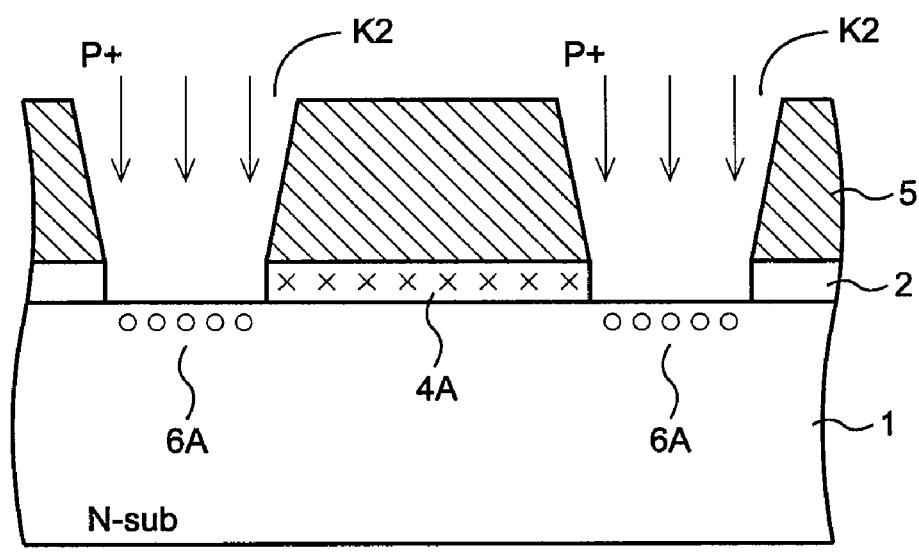

Next, after removing the first photoresist 3, the second photoresist 5 is formed on the insulation film 2, as shown in FIG. 5B. The second photoresist 5 is formed to have the second openings K2 on both sides of the P-type impurity region 4A so that the second openings K2 partially overlap the P-type impurity region 4A.

It is preferable that the insulation film 2, into which the boron ions (B+) are implanted, is partially etched off using the second photoresist 5 as a mask to expose portions of the semiconductor substrate 1. At that time, etching off the portions of the surface of the semiconductor substrate 1 is not required. That is because a concentration of boron impurities (B) in the portions of the surface of the semiconductor substrate 1 is extremely low. Then, phosphorus ions (P+) are implanted into the portions of the surface of the semiconductor substrate 1 using the second photoresist 5 as a mask to form N-type impurity regions 6A that are adjacent the P-type impurity region 4A. The second photoresist 5 is omitted and not shown in FIG. 5A.

After removing the second photoresist 5, the impurities in the P-type impurity region 4A and the impurities in the N-type impurity regions 6A are thermally diffused. With this, the P-type impurity diffusion region is formed in the semiconductor substrate 1 as in the first embodiment. Also as in the first embodiment, the lateral extension of the P-type impurity diffusion region is suppressed because some of the boron impurities (B) are compensated by the phosphorus impurities (P) from the N-type impurity regions 6A. In order to enhance the diffusion of the boron impurities from the insulation film 2 (particularly when it is a silicon oxide film), it is preferable that the thermal diffusion is performed in a hydrogen atmosphere. Gallium (Ga), which has a high diffusion coefficient in the insulation film 2 (particularly when it is a silicon oxide film), may be used instead of boron (B).

When the insulation film 2, into which the boron ions (B+) are implanted, is partially etched off, the P-type impurity region 4A and the N-type impurity regions 6A are formed self-aligned with each other. As a result, impurity profiles in the P-type impurity region 4A and the N-type impurity regions 6A are consistent even when the second photoresist 5 is misaligned to some extent with the first photoresist 3, and a variation in impurity profile in the P-type impurity diffusion region after the thermal diffusion can be suppressed.

Since the methods of manufacturing the semiconductor device according to the first and second embodiments are effective in suppressing the lateral extension of the impurity diffusion region, the methods are generally applicable to forming a well region and forming an isolation region for a semiconductor element. There is hereafter described a method of manufacturing a semiconductor device according to a third embodiment of this invention, which is an example of application of this invention to forming an isolation region in a bipolar process.

Figure 6A:
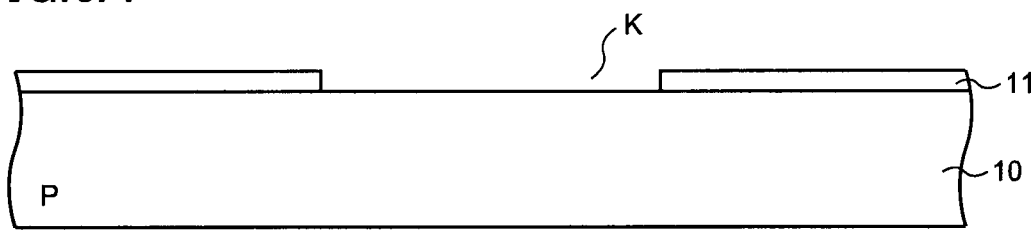
FIGS. 6A, 6B and 6C are cross-sectional views showing a method of manufacturing a semiconductor device according to a third embodiment of this invention.

First, a P-type single crystalline silicon substrate (hereafter referred to as a substrate) 10 is provided as shown in FIG. 6A. A silicon oxide film 11 is formed by thermally oxidizing a surface of the substrate 10. An opening K for impurity injection is formed in the silicon oxide film 11 by applying a photoresist on the silicon oxide film 11, masked exposure and development of the photoresist and etching of the silicon oxide film 11 using the photoresist as a mask.

Figure 6B:
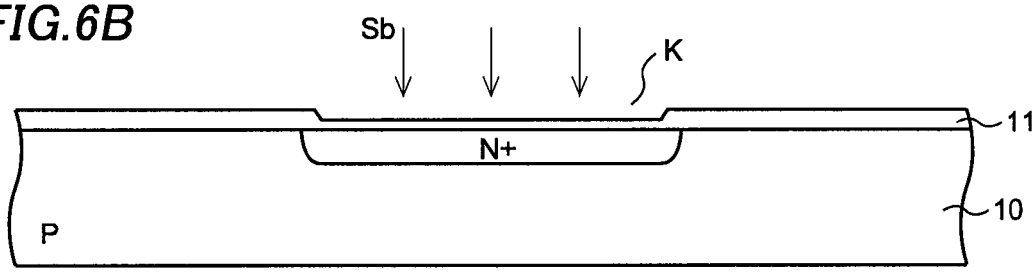

After removing the photoresist, antimony impurities (Sb) are diffused into the substrate 10 through the opening K using the silicon oxide film 11 as a mask, as shown in FIG. 6B.

Figure 6C:
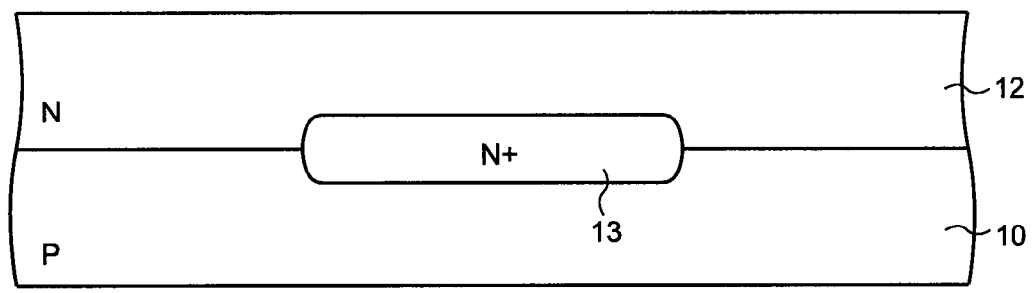

After removing the silicon oxide film 11, an N-type epitaxial layer 12 of a thickness of 10 μm is formed all over the substrate 10 by vapor phase epitaxy, as shown in FIG. 6C. The antimony impurities (Sb) that have been diffused in the substrate 10 are diffused upward into the N-type epitaxial layer 12 during the vapor phase epitaxy to form an N+-type buried layer 13 at an interface between the substrate 10 and the epitaxial layer 12.

Figure 7A:
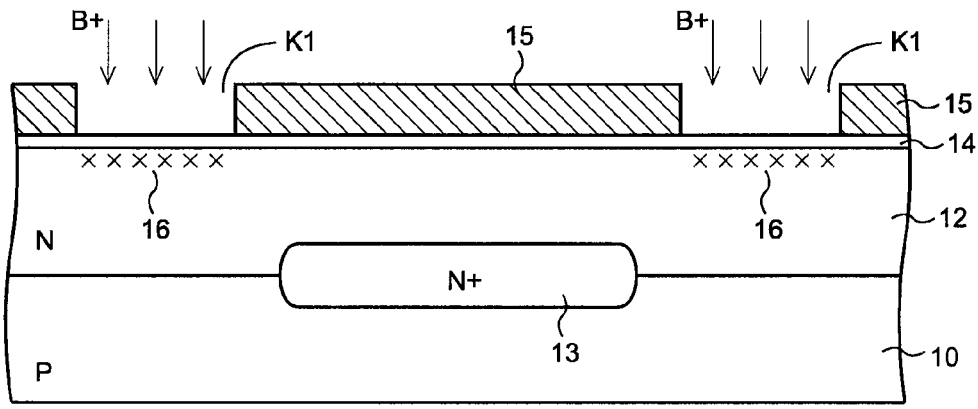
FIGS. 7A, 7B and 7C are cross-sectional views showing the method of manufacturing the semiconductor device according to the third embodiment of this invention.

Next, process steps to form the isolation region will be described referring to FIGS. 7A, 7B and 7C. First, a silicon oxide film 14 of a thickness of 200 nm is formed on a surface of the epitaxial layer 12 by thermal oxidation, as shown in FIG. 7A. A first photoresist 15 having a first opening K1 (boron ion implantation region) is formed on the silicon oxide film 14. When looked from above the substrate 10, the first opening K1 is ring-shaped and surrounds the N+-type buried layer 13. A width of the first opening K1 (boron ion implantation region) is 5 μm.

Boron ions (B+) are implanted into the surface of the epitaxial layer 12 through the silicon oxide film 14 in the first opening K1 to form a P-type impurity region 16, using the first photoresist 15 as a mask. At that time, it is preferable that a peak of a concentration distribution of the boron ions (B+) is placed at the surface of the epitaxial layer 12. The boron ions (B+) are implanted at an acceleration energy of 80 KeV and at a dose of $5 \times 10^{14}/cm^2$, for example.

Figure 7B:
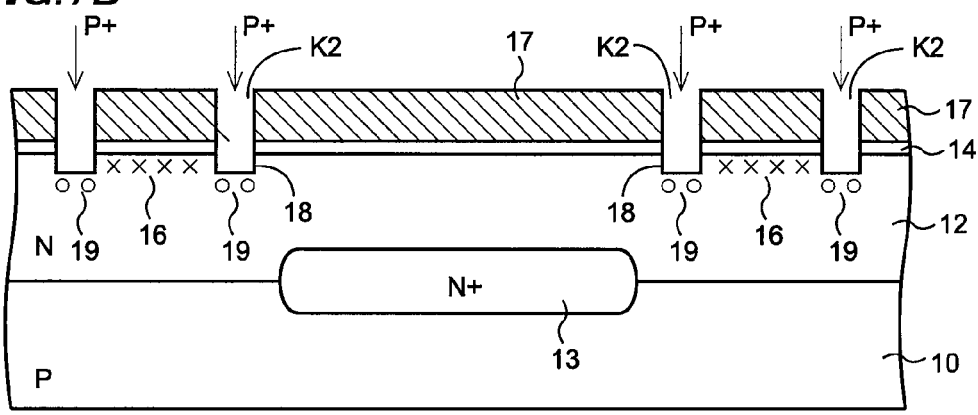

Next, after removing the first photoresist 15, a second photoresist 17 is formed on the silicon oxide film 14, as shown in FIG. 7B. The second photoresist 17 is formed to have second openings K2 (phosphorus ion implantation regions) on both sides of the P-type impurity region 16 so that the second openings K2 partially overlap the P-type impurity region 16. The second openings K2 are formed in a shape of double rings that encompass the P-type impurity region 16 from both sides.

The silicon oxide film 14 is selectively etched off using the second photoresist 17 as a mask. It is preferable that the P-type impurity region 16 is partially removed by further etching the underlying surface of the epitaxial layer 12. The etching forms depressed portions 18 in the surface of the epitaxial layer 12 adjacent the P-type impurity region 16.

Then, phosphorus ions (P+) are implanted into the surface of the epitaxial layer 12 in the etched-off regions using the second photoresist 17 as a mask to form N-type impurity regions 19 that are adjacent the P-type impurity region 16. A width of each of the second openings K2 (phosphorus ion implantation region) is 2 μm. The phosphorus ions (P+) are implanted at an acceleration energy of 110 KeV and at a dose of $5 \times 10^{14}/cm^2$, for example.

When each of the second openings K2 overlaps the P-type impurity region 16 by 0.5 μm, a width of the P-type impurity region 16 is reduced to 4 μm. A width of each of the N-type impurity regions 19 on both sides of the P-type impurity region 16 is 2 μm.

Figure 7C:
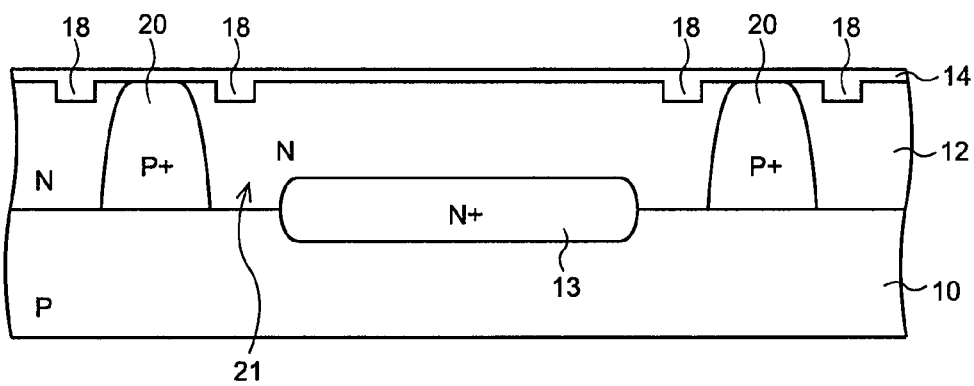
Figure 9:
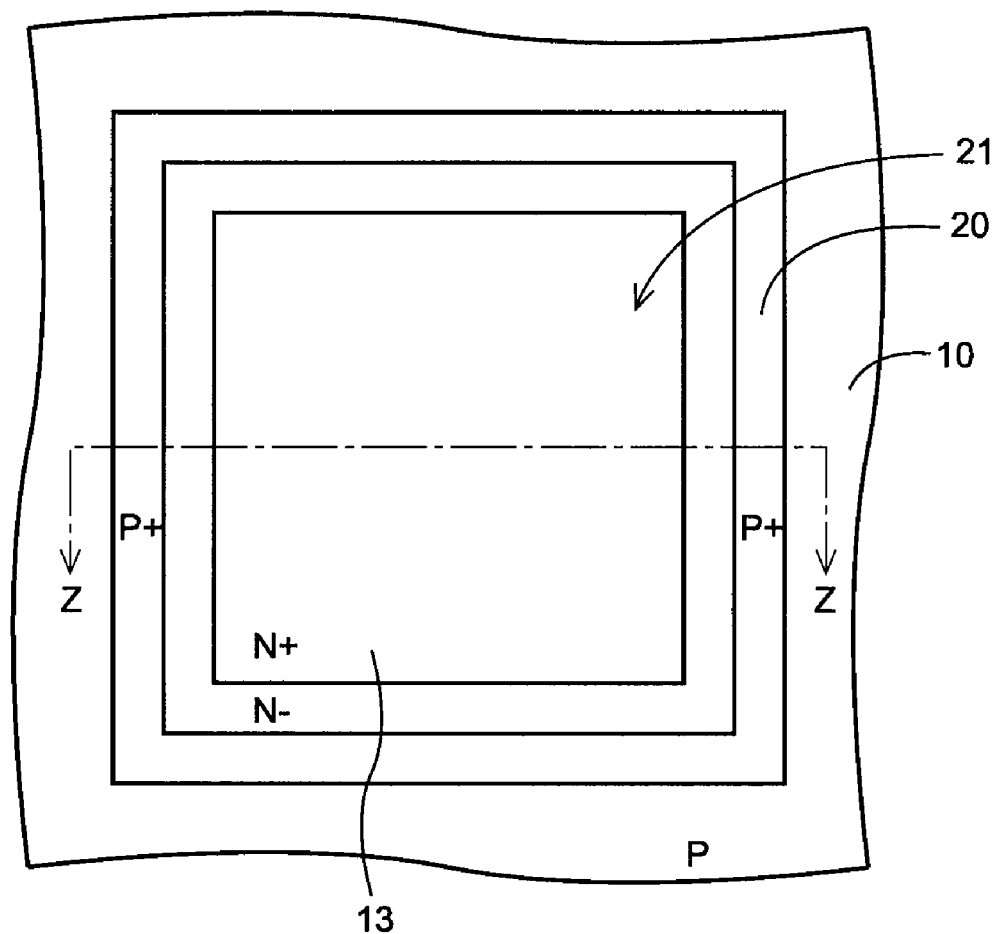
FIG. 9 is a plan view showing the method of manufacturing the semiconductor device according to the third embodiment of this invention.

After removing the second photoresist 17, the impurities in the P-type impurity region 16 and the impurities in the N-type impurity regions 19 are thermally diffused, as shown in FIG. 7C. The thermal diffusion is performed at 1250° C. for 2 hours. With this, a P-type isolation region 20 is formed in the epitaxial layer 12. At that time, lateral extension of the P-type isolation region 20 is suppressed because some of the boron impurities (B) are compensated by the phosphorus impurities (P) from the N-type impurity regions 19. The isolation region 20 is ring-shaped on a plan view as shown in FIG. 9, and a region of the epitaxial layer 12 surrounded by the isolation region 20 makes an island region 21. A plurality of island regions 21 is formed in a semiconductor integrated circuit. Note that FIG. 7C is a cross-sectional view showing a section Z-Z in FIG. 9.

The P-type impurity region 16 and the N-type impurity regions 19 are formed adjacent to and self-aligned with each other, since the N-type impurity regions 19 are formed to overlap regions where the P-type impurity region 16 has been formed and then removed by the partial etching as described above. With this, impurity profiles in the P-type impurity region 16 and the N-type impurity regions 19 are consistent even when the second photoresist 17 is misaligned to some extent with the first photoresist 15, and a variation in impurity profile in the P-type isolation region 20 after the thermal diffusion can be suppressed.

As a result of using boron (B) and phosphorus (P) as the impurities, the impurity profile in the isolation region 20 after the thermal diffusion makes a width of the isolation region 20 narrower at its upper end than at its lower end, as shown in FIG. 7C. The reasons are as described above.

Figure 8A:
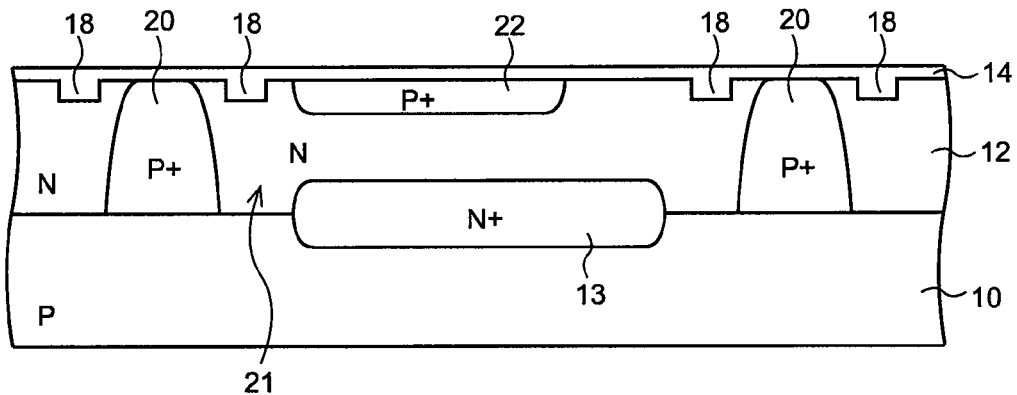
FIGS. 8A, 8B and 8C are cross-sectional views showing the method of manufacturing the semiconductor device according to the third embodiment of this invention.
Figure 8B:
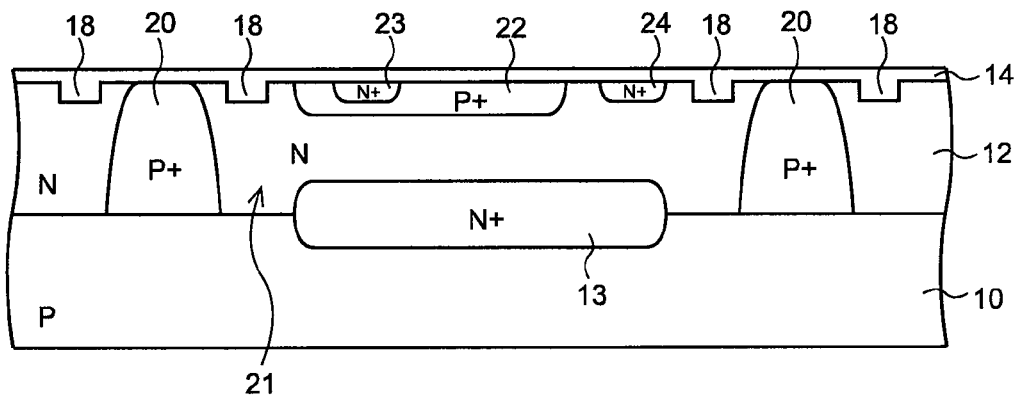

Next, process steps to form a bipolar transistor in the island region 21 will be described referring to FIGS. 8A, 8B and 8C. A P+-type base layer 22 is formed in the surface of the epitaxial layer 12 by ion implantation and subsequent thermal diffusion, as shown in FIG. 8A. An N+-type emitter layer 23 is formed in a surface of the base layer 22 by ion implantation, while an N+-type collector layer 24 is simultaneously formed in the surface of the epitaxial layer 12 adjacent the base layer 22 by ion implantation, as shown in FIG. 8B.

Figure 8C:
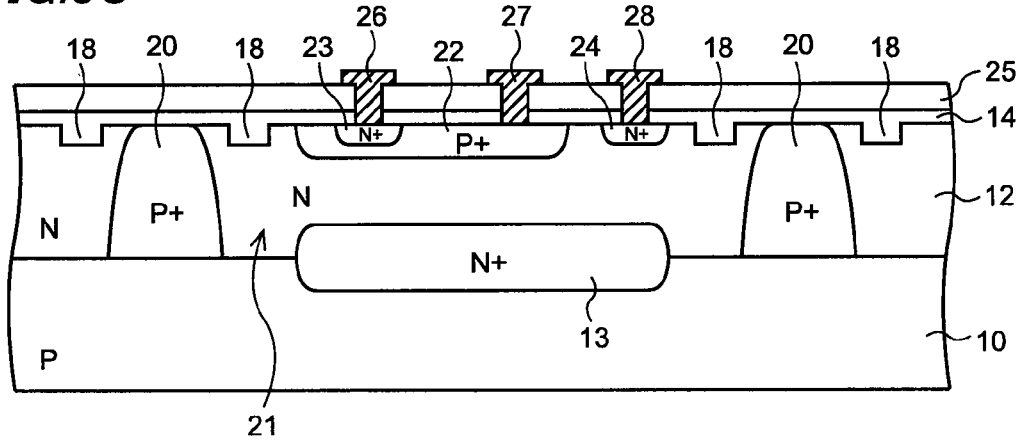

Then an interlayer insulation film 25 made of a silicon oxide film is formed all over the silicon oxide film 14 by CVD (Chemical Vapor Deposition), as shown in FIG. 8C. After that, contact holes are formed by selectively etching the silicon oxide film 14 and the interlayer insulation film 25 on the N+-type emitter layer 23, the P+-type base layer 22 and the N+-type collector layer 24. Then, there are formed an emitter electrode 26, a base electrode 27 and a collector electrode 28 that are electrically connected with the N+-type emitter layer 23, the P+-type base layer 22 and the N+-type collector layer 24, respectively, through corresponding each of the contact holes. As a result, an NPN-type bipolar transistor is formed in the island region 21.

While the boron ions (B+) are implanted into the surface of the epitaxial layer 12 in the third embodiment, the boron ions (B+) may be implanted into the silicon oxide film 14 and then thermally diffused into the epitaxial layer 12, as in the second embodiment.

Because the lateral extension of the isolation region 20 is suppressed with the semiconductor device and its manufacturing method according to the embodiments of this invention, the pattern area of the semiconductor element including the isolation region 20 is reduced and the semiconductor integrated circuit can be reduced in size.

Needless to say, this invention is not limited to the embodiments described above and may be modified within the scope of the invention. For example, the thickness of the insulation film 2, the thickness of the silicon oxide film 14, the width of the first opening K1, the width of the second opening K2, the conditions of the ion implantation, the conditions of the thermal diffusion and the like may be modified as appropriate. Also, not limited to the NPN-type bipolar transistor, other semiconductor elements may be formed in the island region 21.

A semiconductor integrated circuit can be reduced in size according to the embodiments of this invention, since the lateral extension of the impurity region is suppressed when the impurities are thermally diffused in the semiconductor substrate. The embodiments of this invention can be implemented at a low cost because additional process steps required by them are only introducing the impurities for compensation and etching the semiconductor substrate or the insulation film. With a structure described above, a pattern area of the isolation region on a surface of the semiconductor layer can be reduced and a semiconductor integrated circuit that includes the semiconductor device can be reduced in size, because the width of the upper end of the isolation region is narrower than the width of the lower end of the isolation region. Even when an impurity concentration of the isolation region is low at the lower end, the isolation region functions securely because the width of the isolation region is wide at the lower end.

What is claimed is:

1. A semiconductor device comprising:
    a semiconductor substrate of a first general conductivity type;
    a semiconductor layer of a second general conductivity type disposed on the semiconductor substrate; and
    an isolation region of the first general conductivity type formed in the semiconductor layer so as to surround and electrically isolate a portion of the semiconductor layer,
    wherein a width of an upper end of the isolation region is smaller than a width of an lower end of the isolation region.

2. The semiconductor device of claim 1, further comprising a depressed portion formed in the semiconductor layer so as to be adjacent the isolation region.

3. The semiconductor device of claim 1, further comprising a semiconductor element disposed in the semiconductor layer.

4. The semiconductor device of claim 2, further comprising a semiconductor element disposed in the semiconductor layer.

* * * * *